(12) United States Patent
Shim et al.

(10) Patent No.: US 8,278,564 B2
(45) Date of Patent: Oct. 2, 2012

(54) CIRCUIT BOARD VIAHOLES AND METHOD OF MANUFACTURING THE SAME

(75) Inventors: Chang-han Shim, Changwon (KR); Sung-il Kang, Changwon (KR); Se-chuel Park, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 496 days.

(21) Appl. No.: 12/432,898

(22) Filed: Apr. 30, 2009

(65) Prior Publication Data

US 2009/0283316 A1    Nov. 19, 2009

(30) Foreign Application Priority Data

May 16, 2008    (KR) .................. 10-2008-0045511

(51) Int. Cl.
*H05K 1/11* (2006.01)
*H05K 3/10* (2006.01)

(52) U.S. Cl. ........ 174/262; 174/250; 174/257; 174/266; 29/825; 29/846; 427/554

(58) Field of Classification Search .................. 174/250, 174/257, 262, 266; 29/825, 829, 846; 427/554
See application file for complete search history.

(56) References Cited

U.S. PATENT DOCUMENTS

| | | | | |
|---|---|---|---|---|
| 2,576,922 A | * | 12/1951 | Camin et al. | 205/271 |
| 4,934,968 A | * | 6/1990 | Davis et al. | 439/886 |
| 6,638,642 B2 | * | 10/2003 | Kitano et al. | 428/607 |
| 6,665,185 B1 | * | 12/2003 | Kulik et al. | 361/699 |
| 6,833,198 B2 | * | 12/2004 | Sakamoto et al. | 428/596 |
| 7,037,597 B2 | * | 5/2006 | Takami | 428/647 |
| 2002/0182432 A1 | * | 12/2002 | Sakamoto et al. | 428/553 |
| 2003/0148136 A1 | * | 8/2003 | Yamamoto et al. | 428/607 |

FOREIGN PATENT DOCUMENTS

| | | | |
|---|---|---|---|
| EP | 1276358 A1 | * | 1/2003 |
| EP | 1781073 A2 | * | 5/2007 |
| JP | 05-235517 A | | 9/1993 |
| JP | 2003-309356 A | | 10/2003 |
| JP | 2009235580 A | * | 10/2009 |
| KR | 10-2002-0084243 A | | 11/2002 |
| KR | 10-2002-0087469 | | 11/2002 |
| KR | 10-2006-0109122 A | | 10/2006 |

OTHER PUBLICATIONS

Paddock et al., "Transient thermoreflectance from metal films", Optics Letters, vol. 11, No. 5, May 1986, pp. 273-275.*
Paddock et al., "Transient thermoreflectance from thin metal films", Journal of Applied Physics, vol. 60, Jul. 1986, pp. 285-290.*

* cited by examiner

*Primary Examiner* — Robert J Hoffberg
(74) *Attorney, Agent, or Firm* — Drinker Biddle & Reath LLP

(57) ABSTRACT

Provided are a circuit board with a viahole and a method of manufacturing the same. The circuit board includes: a substrate formed of an insulating material; a conductive layer disposed on the substrate; a plated layer comprising nickel and disposed on the conductive layer; and a viahole passing through the substrate, the conductive layer, and the plated layer, wherein a crystal growth direction of nickel in the plated layer is parallel to a thickness-wise direction of the substrate.

6 Claims, 5 Drawing Sheets

CIRCUIT BOARD VIAHOLES AND METHOD OF MANUFACTURING THE SAME

CROSS-REFERENCE TO RELATED PATENT APPLICATIONS

This application claims the benefit of Korean Patent Application No. 10-2008-0045511, filed on May 16, 2008, in the Korean Intellectual Property Office, the disclosure of which is incorporated herein in its entirety by reference.

BACKGROUND OF THE INVENTION

1. Field of the Invention

The present invention relates to a circuit board in which a viahole is easily formed and a method of manufacturing the same.

2. Description of the Related Art

In general, an electronic product includes many elements, and small electronic elements are mounted on a circuit board in the electronic product. The circuit board includes a substrate and a circuit pattern. The substrate includes an insulating material and a conductive layer. The circuit pattern is formed on the conductive layer.

Specifically, a circuit board includes a copper film that forms a circuit pattern electrically connecting chips, resistors, and capacitors, and a substrate formed of a resin material. The circuit board has a plurality of viaholes to connect the circuit pattern to electronic elements, or to connect circuit patterns disposed on different layers to each other.

Viaholes are formed in the circuit board with a laser drill. Since laser energy is absorbed poorly by the copper film formed on the substrate, the efficiency of the process of forming viaholes with the laser drill is low. Low process efficiency leads to longer process time, lower yield, and more variation in the size and shape of the viaholes.

Furthermore, due to such poor absorption of laser, smears, such as ash or tarr, are generated when copper, resin, or glass in the substrate evaporate, and the generated smears are attached around the viaholes.

To increase laser absorption and viahole formation process efficiency, the surface of the circuit board can be black oxidized or coated with a material that has a high laser absorption rate.

Specifically, the circuit substrate can be surface-treated by black oxidation or coated with black or brown oxide. However, such conventional surface treatment processes require a wetting process and thus, additional efforts at managing and operating the overall manufacturing process. In addition, there are physical limitations to the improvement of laser absorption.

SUMMARY OF THE INVENTION

The present invention provides in one embodiment a circuit board including: a substrate formed of an insulating material; a conductive layer disposed on the substrate; a plated layer comprising nickel and disposed on the conductive layer; and a viahole passing through the substrate, the conductive layer, and the plated layer, wherein a crystal growth direction of nickel in the plated layer is parallel to a thickness-wise direction of the substrate.

According to another aspect of the present invention, there is provided a circuit board including: a substrate formed of an insulating material; a conductive layer disposed on the substrate; a plated layer comprising nickel and disposed on the conductive layer; and a viahole passing through the substrate, the conductive layer, and the plated layer, wherein a crystal growth direction of nickel in the plated layer is parallel to a thickness-wise direction of the substrate.

In yet another aspect of the present invention, there is provided a viahole formed through a circuit board with a layer of nickel crystals grown substantially parallel to the viahole.

In various embodiments, the surface roughness (Ra) of the plated layer of nickel crystals may be in a range of 0.4 µm to 0.6 µm, the gloss degree may be in a range of 0.5 to 2, and the thickness may be in a range of 0.01 µm to 0.5 µm.

According to another aspect of the present invention, there is provided a method of manufacturing a circuit board, the method including: preparing a substrate formed of an insulating material; forming a conductive layer on the substrate; plating the conductive layer with nickel to form a plated layer; forming a viahole passing through the substrate, the conductive layer, and the plated layer, wherein a crystal growth direction of nickel in the plated layer is parallel to a thickness-wise direction of the substrate.

In various embodiments, the viahole may be formed using a $CO_2$ laser.

Also in various embodiments, the plated layer of nickel crystals may be formed by providing a current of 10 ASD (A/dm$^2$) to 30 ASD (A/dm$^2$) to the conductive layer. In such embodiments, the plated layer of nickel crystals may be formed by providing a current for 3 seconds to 20 seconds to the conductive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
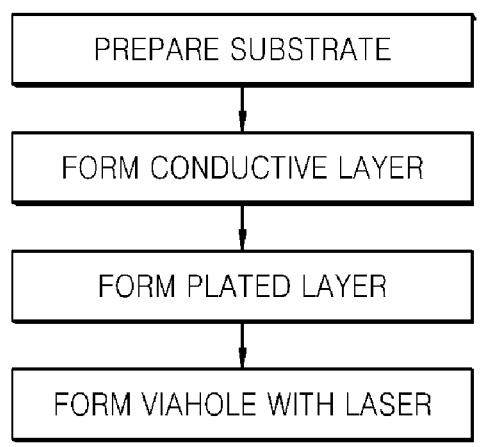
FIG. 1 is a flow chart illustrating a method of manufacturing a circuit board according to an embodiment of the present invention.

FIG. 1 is a flow chart illustrating a method of manufacturing a circuit board according to an embodiment of the present invention. FIGS. 2-9 are views sequentially illustrating a state of a printed circuit board in each phase.

Figure 2:
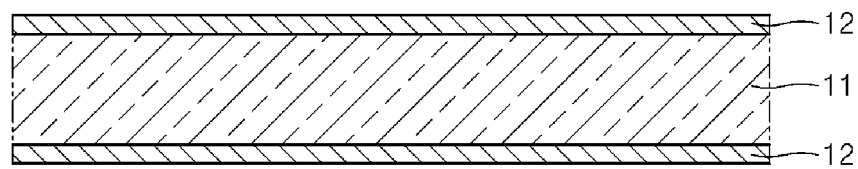
FIG. 2 illustrates a process of preparing a substrate and a process of forming conductive layers on the substrate, included in the method of FIG. 1.

FIG. 2 illustrates a process of preparing a substrate 11 and a process of forming conductive layers 12 on the substrate 11, included in the method of manufacturing a circuit board according to an embodiment of the present invention.

Referring to FIG. 2, the substrate 11 is formed using an insulating material. The substrate 11 may include FR4, which is a mixture of epoxy and glass, but can also include other materials. For example, the substrate 11 may include a polymer, such as PET or polyimide. In addition, the substrate 11 can be formed of a flexible material. The substrate 11 can further include an inorganic material and a core material (not shown).

The conductive layers 12 are formed on opposite surfaces of the substrate 11. Later, interconnection lines through which electric signals are transmitted will be formed in the conductive layers 12 of the circuit board. The conductive layers 12 may be formed of copper.

In the embodiment shown, the conductive layers 12 are formed on opposite surfaces of the substrate 11, but the structure of the conductive layers 12 is not limited thereto. For example, a conductive layer can also be formed only on one surface of a substrate.

Figure 3:
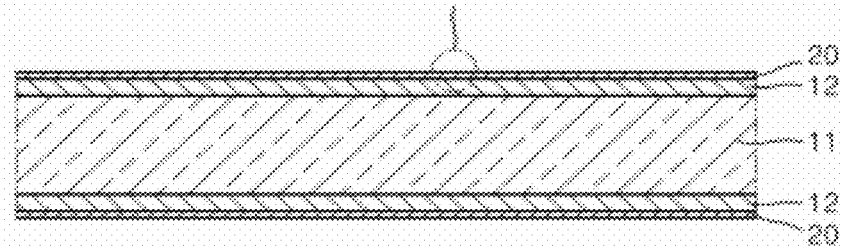
FIG. 3 illustrates a process of forming plated layers, included in the method of FIG. 1.

FIG. 3 illustrates a process of forming plated layers 20, included in the method of manufacturing a circuit board according to an embodiment of the present invention.

Referring to FIG. 3, each plated layer 20 including nickel is formed on each conductive layer 12. In the process of forming the plated layers 20, a crystal growth direction of nickel is adjusted to have a predetermined direction. Specifically, the crystal growth direction of nickel in the plated layers 20 may be parallel to a thickness-wise direction of the substrate 11.

Figure 4:
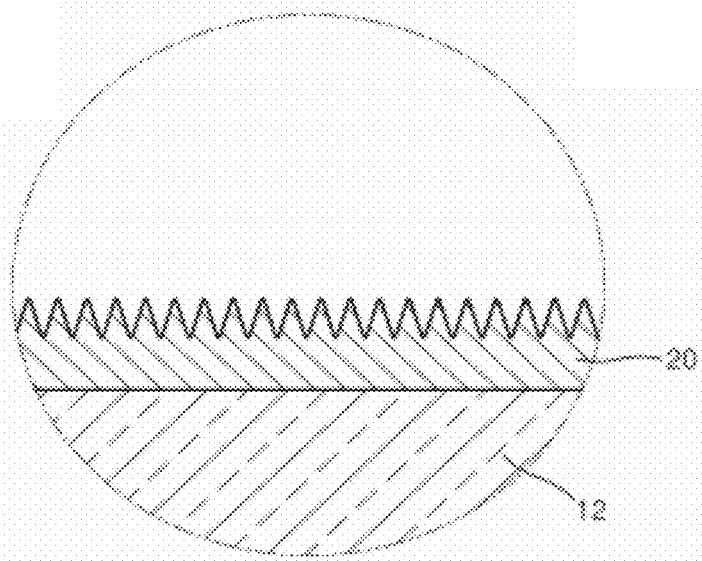
FIG. 4 is an enlarged view of a portion A of FIG. 3.

FIG. 4 is an enlarged view of a portion A of FIG. 3. Referring to FIG. 4, in the process of forming the plated layers 20, the crystal growth direction of nickel is parallel to the thickness-wise direction of the substrate 11 and thus, the plated layers 20 have a corrugated surface having a predetermined roughness.

Figure 5:
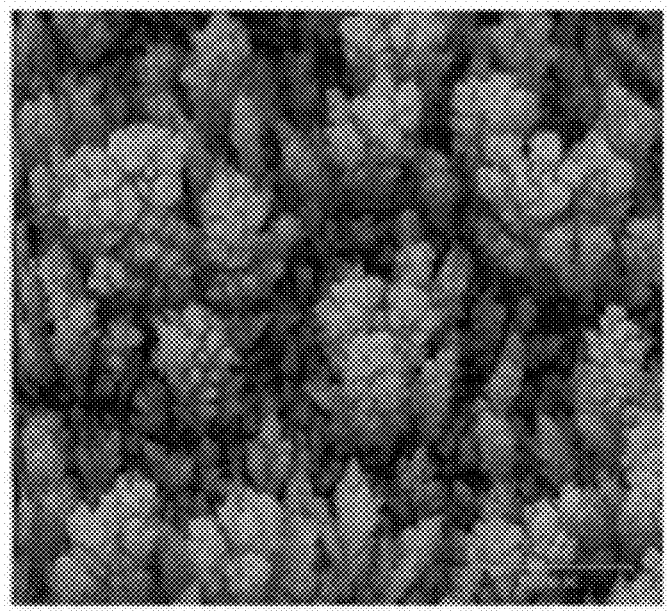
FIG. 5 is an optical microscopic image (5000× magnification) of a surface of a plated layer of FIGS. 3 and 4.

FIG. 5 is an optical microscopic image (5000× magnification) of the surface of the plated layer 20 of FIGS. 3 and 4. Referring to FIG. 5, the crystal growth direction of nickel forming the plated layer 20 can be easily identified. The crystal growth direction of nickel forming the plated layer 20 is perpendicular to the surface of the plated layer 20. That is, the crystal growth direction of nickel is parallel to the thickness-wise direction of the substrate 11.

A thickness of the plated layers 20 may be in a range of 0.01 µm to 0.5 µm. When the thickness of the plated layers 20 is less than 0.01 µm, the plated layers 20 may not have sufficient surface roughness and a laser irradiated to a surface of the plated layers 20 may be easily reflected therefrom. Therefore, the plated layers 20 should be formed to a thickness of at least 0.01 µm.

When the thickness of the plated layers 20 is greater than 0.5 µm, nickel may grow too much and a surface layer of the plated layers 20 may be easily exfoliated. Therefore, the plated layer 20 should be formed to a thickness of 0.5 µm or less.

The plated layers 20 may be formed to have a predetermined nickel crystal growth direction by using various methods.

For example, the plated layers 20 may be formed using a plating bath containing 30 g/l of nickel sulfate or 30 g/l of nickel chloride, 30 g/l of ammonium sulfate, 50 g/l of sodium chloride, and 25 g/l of a boric acid. However, the elements contained in the plating bath are not limited to those described above. That is, the plating bath may contain other types of components in different amounts.

The plated layers 20 can be formed by electroplating, for dexample, by providing a current of 10 ASD (ampere per square decimeter) to 30 ASD. When at least a current of 10 ASD is provided, the crystal growth direction of nickel in the plated layers 20 can be easily adjusted to be perpendicular to the surface of the substrate 11. However, if the current is as high as at least 30 ASD, sparks may occur on the plated layers 20 and thus, the plated layer 20 may not formed well and non-plated areas may be formed.

When the plated layers 20 are formed by electroplating, the current may be provided for 3 seconds to 20 seconds. When the current is provided for 3 seconds or less, the crystal growth of nickel may not be sufficient. On the other hand, when the current is provided for 20 seconds or more, the surface of the plated layers 20 may be contaminated with impurities, such as smuts.

The crystal growth direction of nickel in the plated layers 20 is adjusted to make the surface of the plated layers 20 corrugated. That is, the surface of the plated layers 20 has a predetermined roughness value. The surface roughness of the plated layers 20 may be in a range of 0.4 µm to 0.6 µm. In this regard, the surface roughness refers to an average surface roughness (Ra).

When the surface roughness of the plated layers 20 is less than 0.4 µm, an incident laser may be easily reflected therefrom. On the other hand, when the surface roughness of the plated layers 20 is more than 0.6 µm, the surface layer of the plated layers 20 is exfoliated. Therefore, the surface roughness of the plated layer 20 may be in a range of 0.4 µm to 0.6 µm.

In general, a nickel-plated product has a very small surface roughness value. Therefore, the nickel-plated surface is slippery and thus, most of light irradiated thereto is reflected. However, the crystal growth direction of nickel in the plated layers 20 used in the current embodiment is adjusted to be parallel to a thickness-wise direction of the substrate 11 and thus, the plated layers 20 have a large surface roughness.

The plated layers 20 have a low gloss degree due to such a high surface roughness. The surface of the plated layers 20 may have a gloss degree of 0.5 to 2. When the gloss degree of the surface of the plated layers 20 is less than 0.5, the amount of the absorbed laser is smaller than the amount of the reflected laser. Therefore, a gloss degree of the surface of the plated layer 20 is at least 0.5.

In addition, to make the surface of the plated layers 20 have more than 2.0 of a gloss degree, the plated layers 20 should have a large thickness. However, when the plated layers 20 are thick, a surface layer of the plated layers 20 may be easily exfoliated. Therefore, a gloss degree of the surface of the plated layers 20 may be adjusted to be in a range of at most 2.0.

Therefore, when a laser is irradiated to the plated layers 20 in the subsequent process, reflection of the laser can be prevented and an absorption rate of the laser can be increased.

Figure 6:
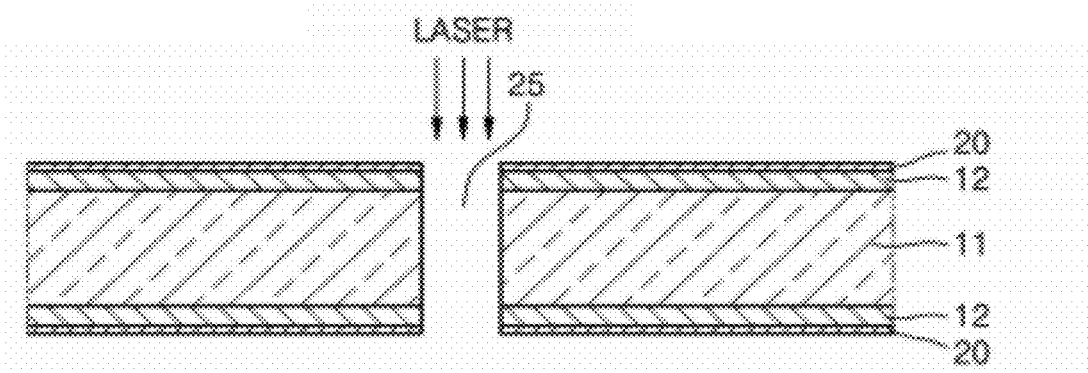
FIG. 6 illustrates a process of forming a viahole with a laser drill, included in the method of FIG. 1.

FIG. 6 illustrates a process of forming a viahole 25 with a laser drill, included in the method of manufacturing a circuit board according to an embodiment of the present invention.

The viahole 25 allows electronic elements, such as semiconductor chips, resistors, or capacitors, to be electrically connected to a circuit pattern, or circuit patterns disposed on different layers to be connected to each other.

The viahole 25 is formed by irradiation of a laser. Specifically, the viahole 25 passing through the conductive layer 12 and the substrate 11 is formed with a $CO_2$ laser. The laser reaches the surface of the plated layers 20 before it reaches the conductive layer 12 and the substrate 11.

A major wavelength of the $CO_2$ laser is in the vicinity of 10 µm. However, conventionally, when a viahole is formed with a $CO_2$ laser, a surface of a conductive layer onto which the $CO_2$ laser is incident has a low absorption rate of at most 10%. Due to such a low laser absorption rate, a viahole process efficiency is low, and surroundings of the viahole are contaminated with impurities and thus, it is difficult to precisely form a viahole having a predetermined size.

However, according to the current embodiment, the surface of the plated layers 20 has a corrugated structure. That is, the crystal growth direction of nickel in the plated layers 20 is adjusted to be perpendicular to the surface of the substrate 11 and the corrugated surface can be easily formed. Therefore, the plated layers 20 onto which the $CO_2$ laser is incident have a large surface roughness and thus a laser absorption rate can be increased.

The increase in a laser absorption rate of the plated layers 20 onto which the $CO_2$ laser is incident results in high process efficiency of the viahole 25 and a substantially small process time of the viahole 25. In addition, since the viahole 25 is formed by intensively irradiating the $CO_2$ laser for a short period of time, the surroundings of the viahole 25 can be prevented from being contaminated with burrs or smears. Therefore, the viahole 25 can be easily formed to have a desired size and shape.

As illustrated in FIG. 6, the plated layers 20 are formed, in addition to on a side onto which the laser is incident, on the opposite side thereto. Therefore, a portion of the viahole 25 on the opposite side to the side onto which the laser is incident can also be protected from being contaminated with burrs or smears.

Figure 7:
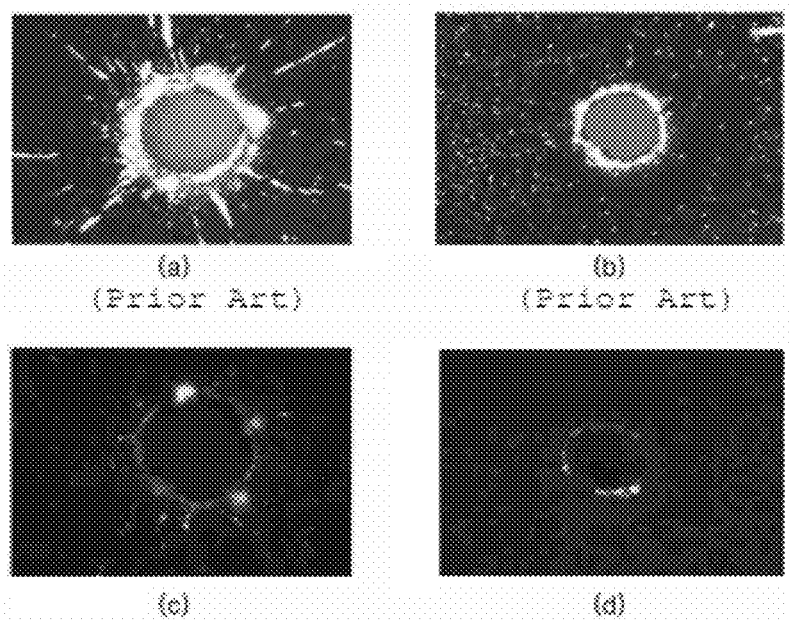
FIG. 7 shows optical images of a conventional viahole and the viahole of FIG. 6.
Figure 8:
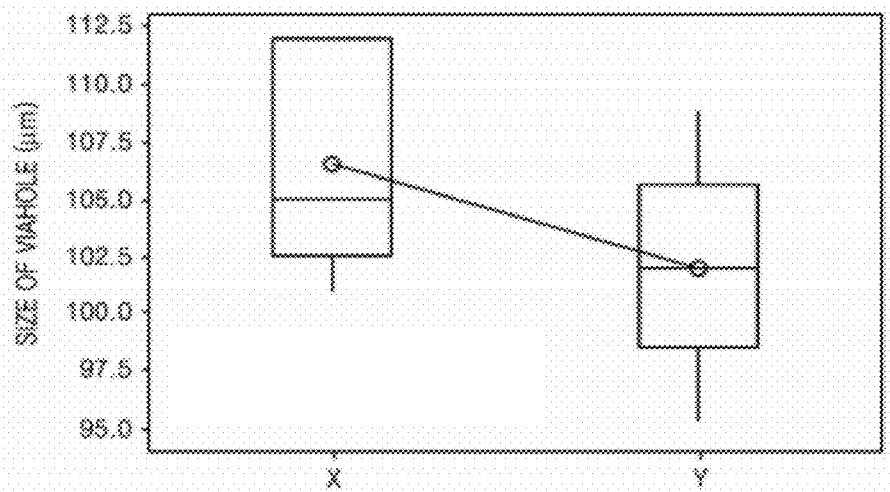
FIG. 8 is a graph for comparing a size of a conventional viahole and a size of the viahole of FIG. 6.

Specifically, a viahole according to the present invention can be compared to a conventional viahole with reference to FIGS. 7 and 8. FIG. 7 shows optical images of a conventional viahole and the viahole of FIG. 6.

In FIG. 7, (a) is an optical image of a conventional viahole on a side a laser enters, (b) is an optical image of the conventional viahole on the opposite side to the side the laser enters, (c) is an optical image of the viahole 25 of FIG. 6 on the side a laser enters, and (d) is an optical image of the viahole 25 of FIG. 6 on the opposite side to the side the laser enters.

Referring to FIG. 7, it can be seen that the interfaces between the viahole 25 and the plated layers 12 used in the current embodiment is less contaminated than the interfaces between the conventional viahole and conductive layers. This is because the process efficiency of the viahole 25 is improved by increasing a laser absorption rate of the plated layers 20 used in the current embodiment.

Due to the same reason described above, the surroundings of the viahole 25 are not contaminated with impurities. Referring to (c) of FIG. 7, the surroundings of the viahole 25 are not contaminated with impurities such as burs or smears shown in (a) of FIG. 7.

Due to the same reason described above, the same results can also be obtained on the opposite side to the side the laser enters. Referring to (b) and (d) of FIG. 7, the interface between the viahole 25 and the plated layer 12 used in the current embodiment is less contaminated than the interface between the conventional viahole and the conductive layer.

Referring to (d) of FIG. 7, the surroundings of the viahole 25 are not contaminated with impurities such as burrs or smears shown in (b) of FIG. 7.

FIG. 8 is a graph for comparing a size of a conventional viahole and a size of the viahole 25 of FIG. 6. In FIG. 8, X represents the conventional viahole, and the Y represents the viahole 25 of FIG. 6. Referring to FIG. 8, it can be seen that the size of the viahole 25 used in the current embodiment is smaller than the size of the conventional viahole.

Conventionally, when a viahole is formed with a laser, it is difficult to precisely form a viahole having a predetermined size because an incident surface to which the laser is irradiated has a low laser absorption rate. That is, to form the viahole having a predetermined size, the laser is irradiated for a long period of time and thus, the size of the obtained viahole often exceeds the predetermined size.

However, according to the current embodiment, a laser absorption rate of the plated layers 20 on the side to which a laser is irradiated is high and a laser can be irradiated for a short time period to form a viahole. Therefore, a viahole having a predetermined size and shape can be formed without errors.

Figure 9:
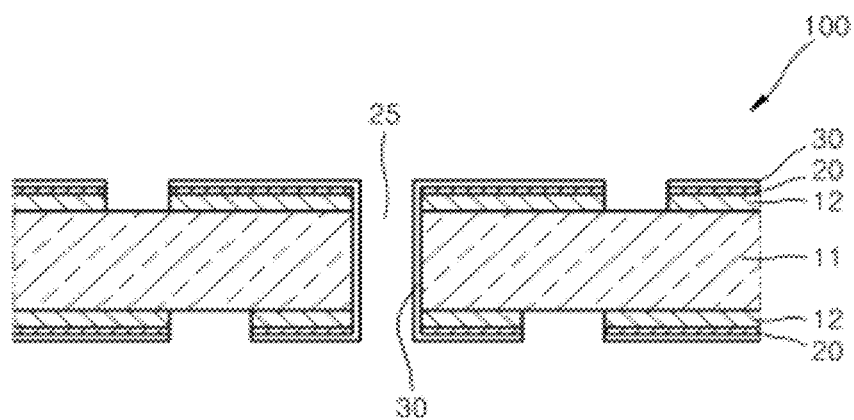
FIG. 9 illustrates a process of forming a conductive connecting layer, included in the method of FIG. 1.

FIG. 9 illustrates a process of forming a conductive connecting layer 30, thereby completing the manufacture of a circuit board 100, included in the method of the circuit board 100 according to an embodiment of the present invention.

The viahole 25 should have conductivity to connect circuit patterns disposed on different layers, but the substrate 11 includes an insulating material. To make side walls of the substrate 11 exposed by the viahole 25 have electroconductivity, the conductive connecting layer 30 is formed on the side walls.

Specifically, the conductive connecting layer 30 that is a thin metal layer is formed on inner walls of the viahole 25 and the surface of the plated layers 20 by electroless plating.

In addition, after the thin metal layer is formed by electroless plating, another metal layer can be formed thereon by electro plating by using the thin metal layer as a seed layer, thereby forming the conductive connecting layer 30.

A circuit board according to the present invention and a method of manufacturing the same are suitable for efficiently increasing a laser absorption rate and easily forming a viahole.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A viahole, the viahole formed through a circuit board, the circuit board comprising
   a conductive layer formed on a substrate of the circuit board; and
   a layer of nickel crystals formed directly on the conductive layer,
   wherein the nickel crystals of the layer of nickel crystals are grown substantially parallel to a depth-wise direction of the viahole; and wherein a surface roughness (Ra) of the layer of the nickel crystals ranges from 0.4 μm to 0.6 μm and is greater than a surface roughness of the conductive layer.

2. The viahole of claim 1, wherein a gloss degree of the layer of nickel crystals is in a range of 0.5 to 2.

3. The viahole of claim 1, wherein the viahole is formed using a $CO_2$ laser.

4. The viahole of claim 1, wherein the layer of nickel crystals is grown by providing a current of 10 ASD (A/dm$^2$) to 30 ASD (A/dm$^2$) to the conductive layer.

5. The viahole of claim 4, wherein the layer of nickel crystals is grown by providing the current for 3 seconds to 20 seconds to the conductive layer.

6. A viahole, the viahole formed through a circuit board, the circuit board comprising a conductive layer formed on a substrate of the circuit board; and a layer of nickel crystals formed directly on the conductive layer, wherein the nickel crystals of the layer of nickel crystals have a crystal growth direction substantially parallel to a depth-wise direction of the viahole; and wherein a surface roughness (Ra) of the layer of the nickel crystals ranges from 0.4 μm to 0.6 μm and is greater than a surface roughness of the conductive layer.

* * * * *